(12) United States Patent
Majumder et al.

(10) Patent No.: US 10,643,016 B1
(45) Date of Patent: May 5, 2020

(54) SYSTEM, METHOD AND COMPUTER PROGRAM PRODUCT FOR DESIGN RULE AWARENESS ASSOCIATED WITH DIE AND PACKAGE ELECTRONIC CIRCUIT CO-DESIGN

(71) Applicant: Cadence Design Systems, Inc., San Jose, CA (US)

(72) Inventors: Chayan Majumder, Uttar Pradesh (IN); Arnold Jean Marie Gustave Ginetti, Antibes (FR); Hitesh Marwah, Uttar Pradesh (IN)

(73) Assignee: Cadence Design Systems, Inc., San Jose, CA (US)

( * ) Notice: Subject to any disclaimer, the term of this patent is extended or adjusted under 35 U.S.C. 154(b) by 14 days.

(21) Appl. No.: 15/846,540

(22) Filed: Dec. 19, 2017

(51) Int. Cl.
*G06F 30/398* (2020.01)
*G06F 30/392* (2020.01)

(52) U.S. Cl.
CPC .......... *G06F 30/398* (2020.01); *G06F 30/392* (2020.01)

(58) Field of Classification Search
CPC ............. G06F 17/5072; G06F 17/5077; G06F 17/5081; G06F 30/398; G06F 30/392
See application file for complete search history.

(56) References Cited

U.S. PATENT DOCUMENTS

| | | | | |
|---|---|---|---|---|
| 4,342,090 A * | 7/1982 | Caccoma | ................ | H01L 21/67 228/180.21 |
| 6,014,508 A * | 1/2000 | Christian | ............ | G06F 17/5077 716/112 |
| 6,295,634 B1 * | 9/2001 | Matsumoto | ......... | G06F 17/5077 703/2 |
| 6,357,036 B1 * | 3/2002 | Eka | ..................... | G06F 17/5068 716/112 |
| 6,466,008 B1 * | 10/2002 | Fung | .................... | G06F 17/5077 716/113 |
| 6,489,557 B2 * | 12/2002 | Eskildsen | ............... | H01L 23/16 174/529 |
| 6,499,134 B1 * | 12/2002 | Buffet | ................. | G06F 17/5077 716/113 |
| 6,581,189 B1 * | 6/2003 | Tain | .................... | G06F 17/5068 703/1 |
| 6,655,022 B1 * | 12/2003 | Eskildsen | ............... | H01L 23/16 257/778 |
| 6,851,100 B1 * | 2/2005 | You | ..................... | G06F 17/5068 700/121 |
| 7,055,124 B2 * | 5/2006 | Frank | .................. | G06F 17/5077 716/112 |
| 7,098,528 B2 * | 8/2006 | Vasishta | ............ | H01L 23/49833 257/668 |

(Continued)

*Primary Examiner* — Helen Rossoshek
(74) *Attorney, Agent, or Firm* — Mark H. Whittenberger, Esq.; Holland & Knight LLP

(57) ABSTRACT

The present disclosure relates to a computer-implemented method for electronic circuit design awareness. Embodiments may include providing, using a processor, an electronic design having a package layout and a die layout associated therewith. Embodiments may also include displaying at a graphical user interface, the package layout and allowing, at the graphical user interface, a user to edit the package layout. Embodiments may further include determining, using the processor, an impact of the edit on the die layout and in response to the edit, mirroring the edit at the die layout.

14 Claims, 13 Drawing Sheets

(56) References Cited

U.S. PATENT DOCUMENTS

| | | | | |
|---|---|---|---|---|
| 7,257,784 B2* | 8/2007 | Cheng | | G06F 17/5081 |
| | | | | 716/112 |
| 7,262,513 B2* | 8/2007 | Mathew | | H01L 24/03 |
| | | | | 257/779 |
| 7,263,683 B1* | 8/2007 | Capodieci | | G03F 1/36 |
| | | | | 716/53 |
| 7,627,838 B2* | 12/2009 | Keswick | | G06F 17/5045 |
| | | | | 716/103 |
| 8,286,110 B1* | 10/2012 | Kukal | | G06F 17/5036 |
| | | | | 716/106 |
| 8,549,457 B1* | 10/2013 | Moore | | G06F 17/5072 |
| | | | | 716/119 |
| 8,645,894 B1* | 2/2014 | Kukal | | G06F 17/5081 |
| | | | | 716/100 |
| 8,875,083 B2* | 10/2014 | Chang | | G06F 17/5077 |
| | | | | 716/126 |
| 9,006,000 B2* | 4/2015 | Hanan | | G01R 31/2884 |
| | | | | 438/11 |
| 9,106,229 B1* | 8/2015 | Hutton | | H03K 19/173 |
| 9,129,081 B2* | 9/2015 | Ginetti | | G06F 17/5068 |
| 9,204,542 B1* | 12/2015 | Lee | | H05K 1/111 |
| 9,304,981 B1* | 4/2016 | Patidar | | G06F 16/24573 |
| 9,454,634 B1* | 9/2016 | Kukal | | G06F 17/5072 |
| 9,672,308 B1* | 6/2017 | Majumder | | G06F 30/39 |
| 9,934,354 B1* | 4/2018 | Kukal | | G06F 17/5081 |
| 10,056,304 B2* | 8/2018 | Bishop | | H01L 24/96 |
| 10,109,621 B2* | 10/2018 | Lee | | G06F 17/5081 |
| 10,285,276 B1* | 5/2019 | Kukal | | H05K 3/0005 |
| 10,467,371 B1* | 11/2019 | Majumder | | G06F 17/5072 |
| 2014/0033149 A1* | 1/2014 | Groves | | G06F 17/5036 |
| | | | | 716/112 |
| 2017/0170144 A1* | 6/2017 | Williams | | H01L 24/97 |
| 2018/0314783 A1* | 11/2018 | Moroz | | G06F 17/5081 |
| 2019/0035746 A1* | 1/2019 | Lai | | H01L 23/573 |
| 2019/0050518 A1* | 2/2019 | Jiang | | G06F 17/5081 |
| 2019/0148227 A1* | 5/2019 | Zhang | | H01L 23/50 |
| | | | | 257/777 |

\* cited by examiner

SYSTEM, METHOD AND COMPUTER PROGRAM PRODUCT FOR DESIGN RULE AWARENESS ASSOCIATED WITH DIE AND PACKAGE ELECTRONIC CIRCUIT CO-DESIGN

FIELD OF THE INVENTION

The present disclosure relates to electronic circuit design, and more specifically, to design rule awareness associated with such designs.

DISCUSSION OF THE RELATED ART

In existing electronic circuit design systems it may be possible to operate upon both a package layout and a die layout concurrently. In some cases a designer may make a change in the package layout and that change may be reflected in the die layout. However, this functionality may introduce unwanted errors in one of the layouts.

SUMMARY

In one or more embodiments of the present disclosure, a computer-implemented method is provided. The method may include providing, using a processor, an electronic design having a package layout and a die layout associated therewith. The method may also include displaying at a graphical user interface, the package layout and allowing, at the graphical user interface, a user to edit the package layout. The method may further include determining, using the processor, an impact of the edit on the die layout and in response to the edit, mirroring the edit at the die layout.

One or more of the following features may be included. In some embodiments, determining may include determining at least one of a design rule check violation and a short at the die layout. The method may further include displaying at least one of the design rule check violation and the short at the graphical user interface. The method may also include allowing, at the graphical user interface, the user to alter the edit based upon, at least in part, the determining. The method may further include determining an impact of the edit on the package layout. The method may also include simultaneously displaying a violation associated with the package layout and a violation associated with the die layout at the graphical user interface. The method may further include calculating a minimum movement at the package layout to satisfy one or more design rules associated with both the package layout and the die layout.

In one or more embodiments of the present disclosure, a system having a computing device including at least one processor is provided. The at least one processor may be configured to provide an electronic design having a package layout and a die layout associated therewith. The at least one processor may be further configured to display at a graphical user interface, the package layout. The at least one processor may be further configured to allow, at the graphical user interface, a user to edit the package layout. The at least one processor may be further configured to determine, using the processor, an impact of the edit on the die layout and in response to the edit, the at least one processor may be further configured to mirror the edit at the die layout.

One or more of the following features may be included. In some embodiments, determining may include determining at least one of a design rule check violation and a short at the die layout. The at least one processor may be configured to display at least one of the design rule check violation and the short at the graphical user interface. The at least one processor may be further configured to allow, at the graphical user interface, the user to alter the edit based upon, at least in part, the determining. The at least one processor may be configured to determine an impact of the edit on the package layout. The at least one processor may be further configured to simultaneously display a violation associated with the package layout and a violation associated with the die layout at the graphical user interface. The at least one processor may be further configured to calculate a minimum movement at the package layout to satisfy one or more design rules associated with both the package layout and the die layout.

In yet another embodiment of the present disclosure a non-transitory computer readable medium having stored thereon instructions that when executed by a processor result in one or more operations is included. Operations may include providing, using a processor, an electronic design having a package layout and a die layout associated therewith. Operations may also include displaying at a graphical user interface, the package layout and allowing, at the graphical user interface, a user to edit the package layout. Operations may further include determining, using the processor, an impact of the edit on the die layout and in response to the edit, mirroring the edit at the die layout.

One or more of the following features may be included. In some embodiments, determining may include determining at least one of a design rule check violation and a short at the die layout. Operations may further include displaying at least one of the design rule check violation and the short at the graphical user interface. Operations may also include allowing, at the graphical user interface, the user to alter the edit based upon, at least in part, the determining. Operations may further include determining an impact of the edit on the package layout. Operations may also include simultaneously displaying a violation associated with the package layout and a violation associated with the die layout at the graphical user interface. Operations may further include calculating a minimum movement at the package layout to satisfy one or more design rules associated with both the package layout and the die layout.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

DETAILED DESCRIPTION

Figure 1:
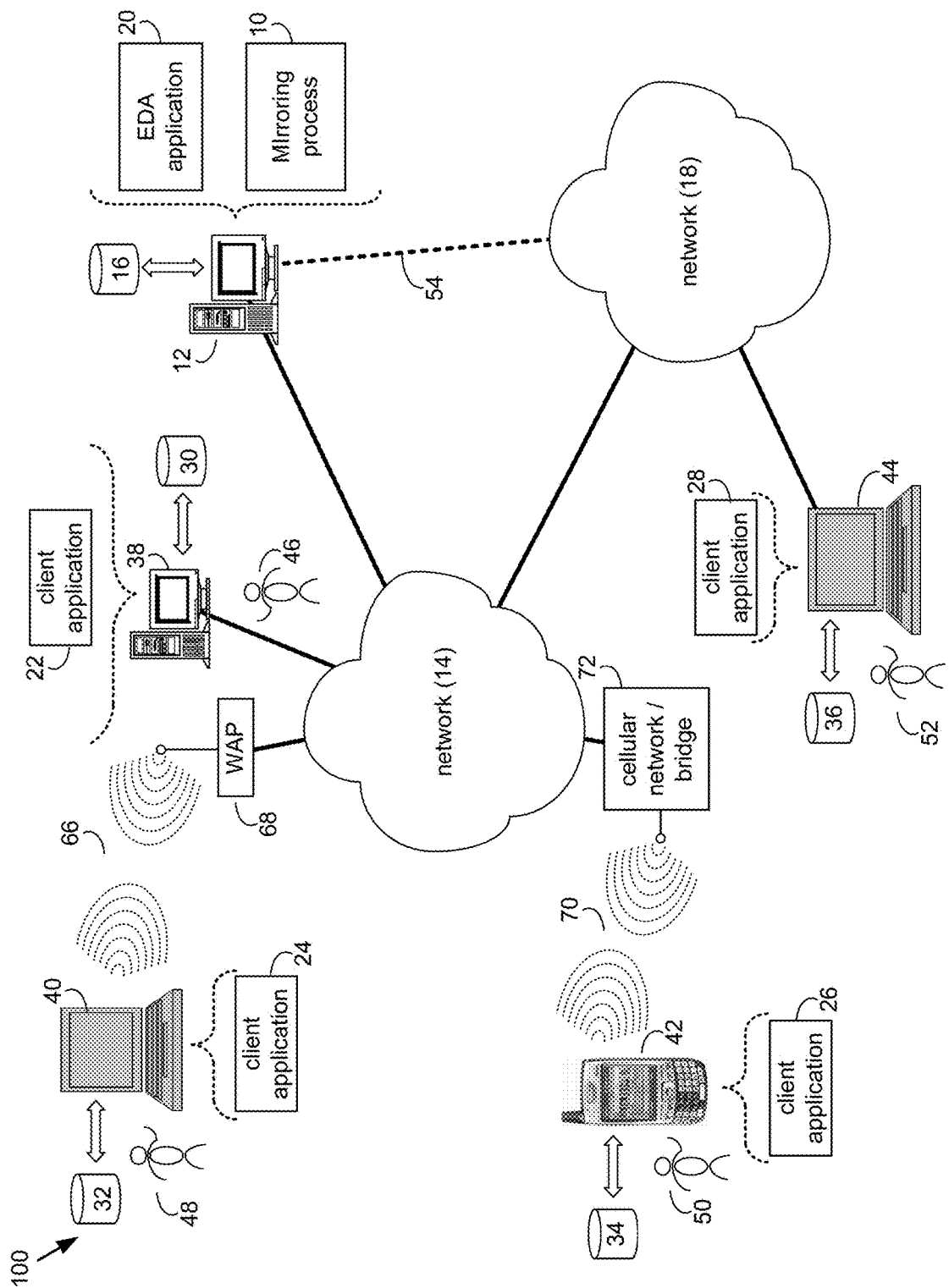
FIG. 1 is a diagram depicting an embodiment of a system in accordance with the present disclosure.

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

As will be appreciated by one skilled in the art, the present disclosure may be embodied as a method, system, or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

As used in any embodiment described herein, "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof.

Any suitable computer usable or computer readable medium may be utilized. The computer readable medium may be a computer readable signal medium or a computer readable storage medium. A computer-usable, or computer-readable, storage medium (including a storage device associated with a computing device or client electronic device) may be, for example, but not limited to, an electronic, magnetic, optical, electromagnetic, infrared, or semiconductor system, apparatus, or device, or any suitable combination of the foregoing. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device. In the context of this document, a computer-usable, or computer-readable, storage medium may be any tangible medium that can contain, or store a program for use by or in connection with the instruction execution system, apparatus, or device.

A computer readable signal medium may include a propagated data signal with computer readable program coded embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations of the present invention may be written in an object oriented programming language such as Java, Smalltalk, C++ or the like. However, the computer program code for carrying out operations of the present invention may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

One or more hardware description languages may be used in accordance with the present disclosures. Some hardware description languages may include, but are not limited to, Verilog, VHDL, and Verilog-AMS. Various other hardware description languages may also be used as well.

Referring to FIG. 1, there is shown mirroring process 10 that may reside on and may be executed by server computer 12, which may be connected to network 14 (e.g., the Internet or a local area network). Examples of server computer 12 may include, but are not limited to: a personal computer, a server computer, a series of server computers, a mini computer, and a mainframe computer. Server computer 12 may be a web server (or a series of servers) running a network operating system, examples of which may include but are not limited to: Microsoft® Windows® Server; Novell® NetWare®; or Red Hat® Linux®, for example. (Microsoft and Windows are registered trademarks of Microsoft Corporation in the United States, other countries or both; Novell and NetWare are registered trademarks of Novell Corporation in the United States, other countries or both; Red Hat is a registered trademark of Red Hat Corporation in the United States, other countries or both; and Linux is a registered trademark of Linus Torvalds in the United States, other countries or both.) Additionally/alternatively, the mirroring process 10 may reside on and be executed, in whole or in part, by a client electronic device, such as a personal computer, notebook computer, personal digital assistant, or the like.

The instruction sets and subroutines of mirroring process 10, which may include one or more software modules, and which may be stored on storage device 16 coupled to server computer 12, may be executed by one or more processors (not shown) and one or more memory modules (not shown) incorporated into server computer 12. Storage device 16 may include but is not limited to: a hard disk drive; a solid state drive, a tape drive; an optical drive; a RAID array; a random access memory (RAM); and a read-only memory (ROM). Storage device 16 may include various types of files and file types including but not limited, to hardware description language (HDL) files, which may contain the port type descriptions and executable specifications of hardware blocks.

Server computer 12 may execute a web server application, examples of which may include but are not limited to: Microsoft IIS, Novell Webserver™, or Apache® Webserver, that allows for HTTP (e.g., HyperText Transfer Protocol) access to server computer 12 via network 14 (Webserver is a trademark of Novell Corporation in the United States, other countries, or both; and Apache is a registered trademark of Apache Software Foundation in the United States, other countries, or both). Network 14 may be connected to one or more secondary networks (e.g., network 18), examples of which may include but are not limited to: a local area network; a wide area network; or an intranet, for example.

Server computer 12 may execute an electronic design automation (EDA) application (e.g., EDA application 20), examples of which may include, but are not limited to those available from the assignee of the present application. EDA application 20 may interact with one or more EDA client applications (e.g., EDA client applications 22, 24, 26, 28) for electronic design optimization.

Mirroring process 10 may be a stand alone application, or may be an applet/application/script that may interact with and/or be executed within EDA application 20. In addition/ as an alternative to being a server-side process, the mirroring process may be a client-side process (not shown) that may reside on a client electronic device (described below) and may interact with an EDA client application (e.g., one or more of EDA client applications 22, 24, 26, 28). Further, the mirroring process may be a hybrid server-side/client-side process that may interact with EDA application 20 and an EDA client application (e.g., one or more of client applications 22, 24, 26, 28). As such, the mirroring process may reside, in whole, or in part, on server computer 12 and/or one or more client electronic devices.

The instruction sets and subroutines of EDA application 20, which may be stored on storage device 16 coupled to server computer 12 may be executed by one or more processors (not shown) and one or more memory modules (not shown) incorporated into server computer 12.

The instruction sets and subroutines of EDA client applications 22, 24, 26, 28, which may be stored on storage devices 30, 32, 34, 36 (respectively) coupled to client electronic devices 38, 40, 42, 44 (respectively), may be executed by one or more processors (not shown) and one or more memory modules (not shown) incorporated into client electronic devices 38, 40, 42, 44 (respectively). Storage devices 30, 32, 34, 36 may include but are not limited to: hard disk drives; solid state drives, tape drives; optical drives; RAID arrays; random access memories (RAM); read-only memories (ROM), compact flash (CF) storage devices, secure digital (SD) storage devices, and a memory stick storage devices. Examples of client electronic devices 38, 40, 42, 44 may include, but are not limited to, personal computer 38, laptop computer 40, mobile computing device 42 (such as a smart phone, netbook, or the like), notebook computer 44, for example. Using client applications 22, 24, 26, 28, users 46, 48, 50, 52 may access EDA application 20 and may allow users to e.g., utilize mirroring process 10.

Users 46, 48, 50, 52 may access EDA application 20 directly through the device on which the client application (e.g., client applications 22, 24, 26, 28) is executed, namely client electronic devices 38, 40, 42, 44, for example. Users 46, 48, 50, 52 may access EDA application 20 directly through network 14 or through secondary network 18. Further, server computer 12 (e.g., the computer that executes EDA application 20) may be connected to network 14 through secondary network 18, as illustrated with phantom link line 54.

The various client electronic devices may be directly or indirectly coupled to network 14 (or network 18). For example, personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 66 established between laptop computer 40 and wireless access point (e.g., WAP) 68, which is shown directly coupled to network 14. WAP 68 may be, for example, an IEEE 802.11a, 802.11b, 802.11g, Wi-Fi, and/or Bluetooth device that is capable of establishing wireless communication channel 66 between laptop computer 40 and WAP 68. Mobile computing device 42 is shown wirelessly coupled to network 14 via wireless communication channel 70 established between mobile computing device 42 and cellular network/bridge 72, which is shown directly coupled to network 14.

As is known in the art, all of the IEEE 802.11x specifications may use Ethernet protocol and carrier sense multiple access with collision avoidance (e.g., CSMA/CA) for path sharing. The various 802.11x specifications may use phase-shift keying (e.g., PSK) modulation or complementary code keying (e.g., CCK) modulation, for example. As is known in the art, Bluetooth is a telecommunications industry specification that allows e.g., mobile phones, computers, and personal digital assistants to be interconnected using a short-range wireless connection.

Client electronic devices 38, 40, 42, 44 may each execute an operating system, examples of which may include but are not limited to Microsoft Windows, Microsoft Windows CE®, Red Hat Linux, or other suitable operating system. (Windows CE is a registered trademark of Microsoft Corporation in the United States, other countries, or both.)

Figure 2:
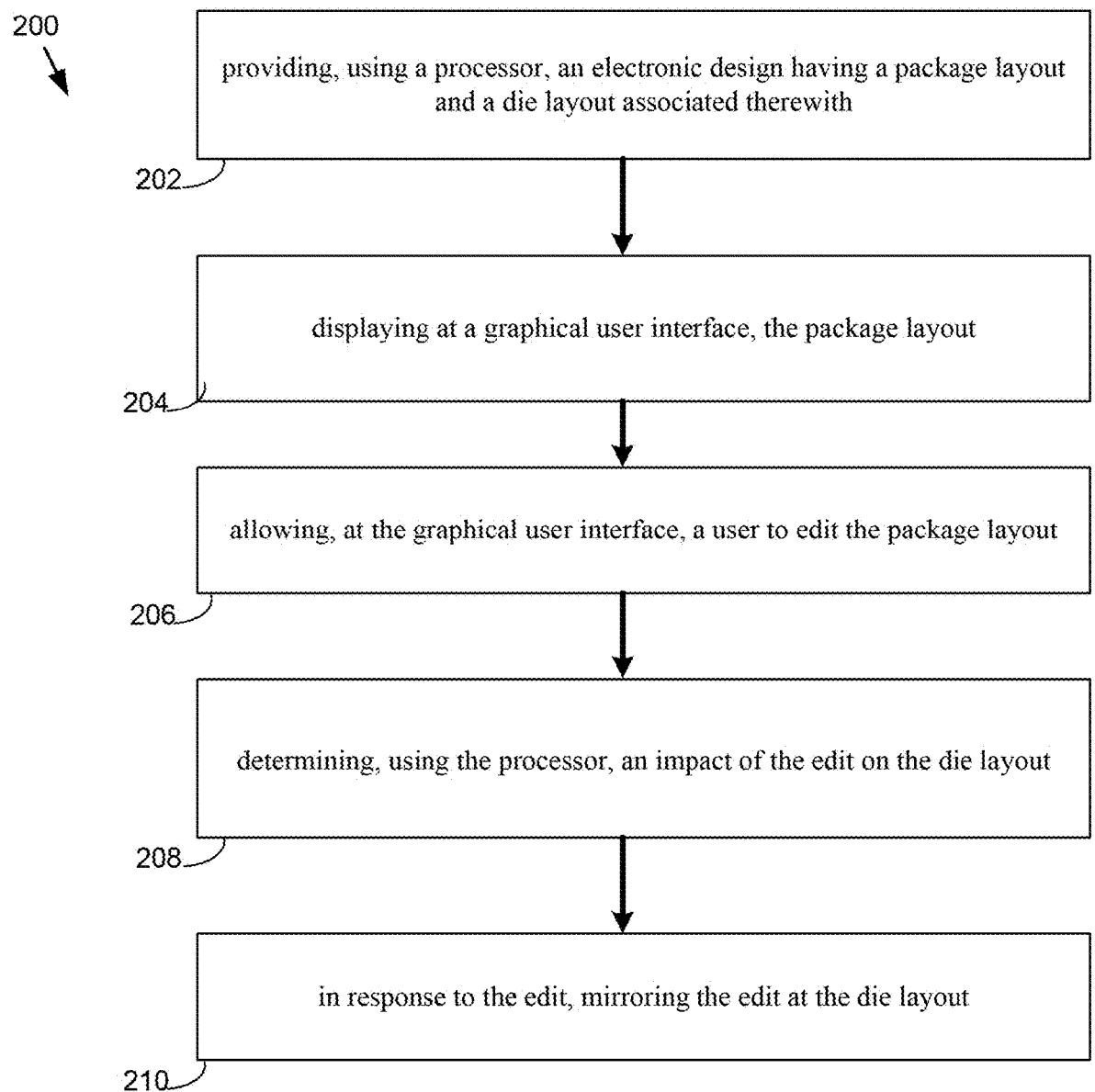
FIG. 2 is a flowchart depicting operations incorporating the mirroring process in accordance with an embodiment of the present disclosure.

Referring now to FIG. 2, an example flowchart depicting operations consistent with an embodiment of mirroring process 10 is provided. Operations may include providing (202), using a processor, an electronic design having a package layout and a die layout associated therewith. Operations may also include displaying (204) at a graphical user interface, the package layout and allowing (206), at the graphical user interface, a user to edit the package layout. The method may further include determining (208), using the processor, an impact of the edit on the die layout and in response to the edit, mirroring (210) the edit at the die layout. Each of these operations is discussed in further detail hereinbelow.

In some systems, when a user was editing in a package layout, an Edit-In-Concert feature may automatically mirror the edits in the actual die layout. However, this introduces violations (e.g., DRC and shorts) on the die layout without user's knowledge. Accordingly, embodiments of mirroring process 10 may address these issues as when the user is editing the die footprint in the package layout the process may be configured to mirror the changes in the die layout. Mirroring process 10 may then dynamically check the impact of that edit on the die layout (e.g., DRC violations, shorts, etc.). Additionally and/or alternatively, mirroring process 10 may provide a live display of the violations occurring in the die layout on the package layout. Some or all of the above may occur while retaining full context between the package layout and the die layout. In this way, the user may now know initially if the edits in the package layout may cause any violations in the die layout, in which case the user may avoid that edit and avoid costly iterations later on. Embodiments of mirroring process 10 may be applicable in any suitable environment including, but not limited to, 2.5D/3DIC, etc.

Figure 3:
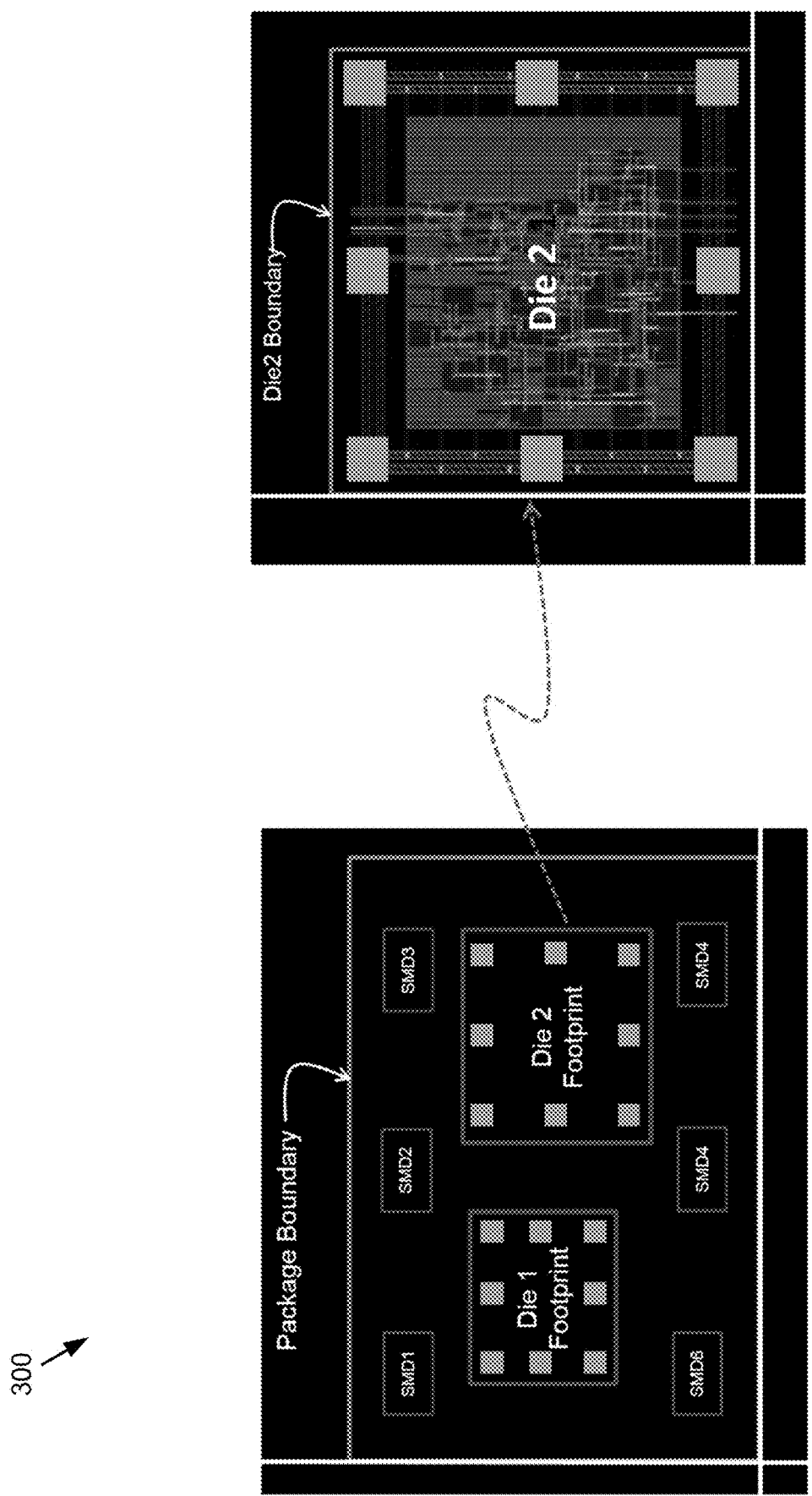
FIG. 3 is a diagram depicting package and/or die layouts in accordance with an embodiment of the present disclosure.

Referring now to FIG. 3, a diagram 300 consistent with an embodiment of mirroring process 10 is provided. Diagram 300 shows a package layout with die footprints on the left side of the diagram and an actual layout of Die2 from which the footprint was generated on the right hand side. The process allows for the user to design both the die and package concurrently.

Figure 4:
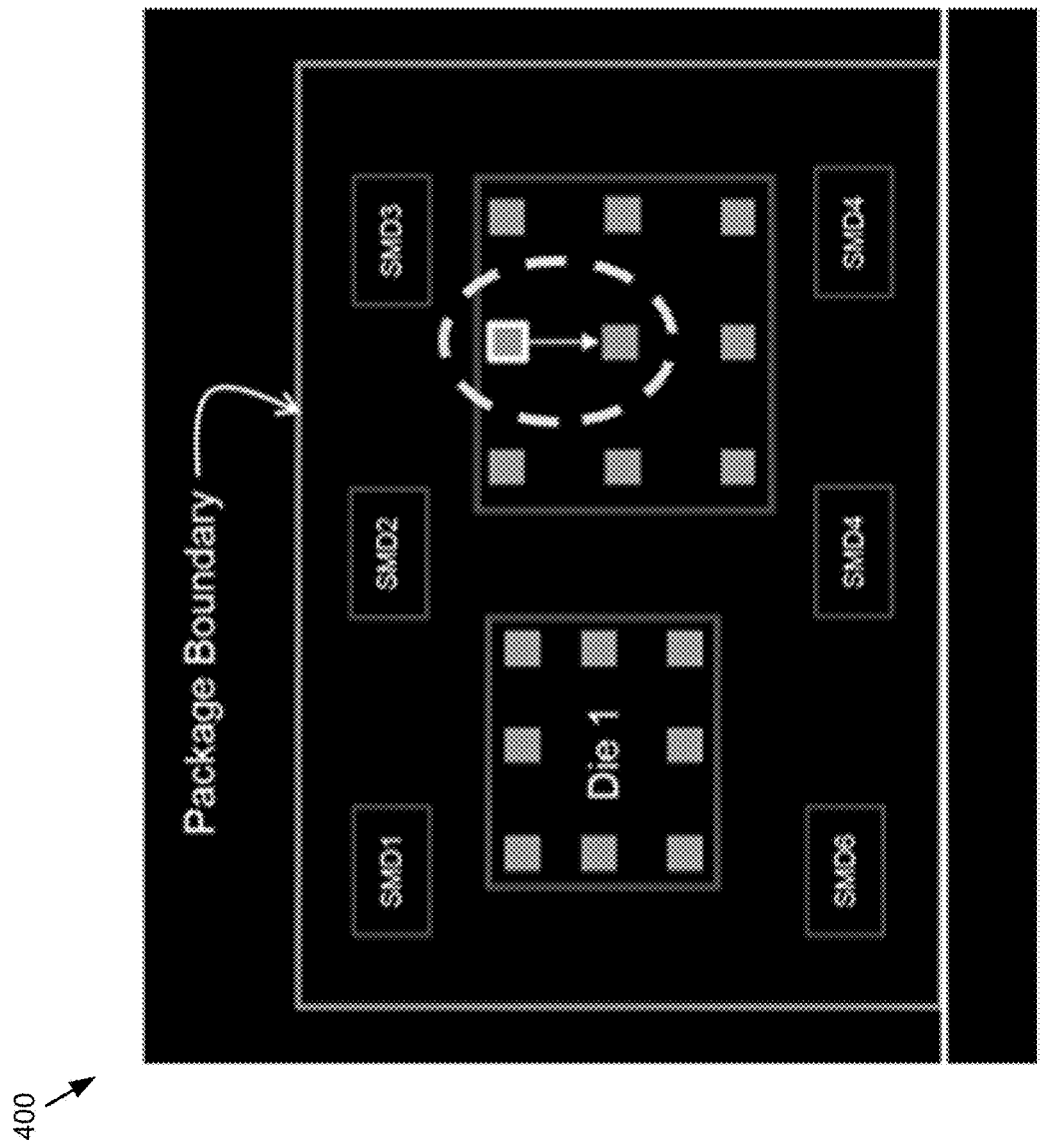
FIG. 4 is a diagram depicting package and/or die layouts in accordance with an embodiment of the present disclosure.
Figure 5:
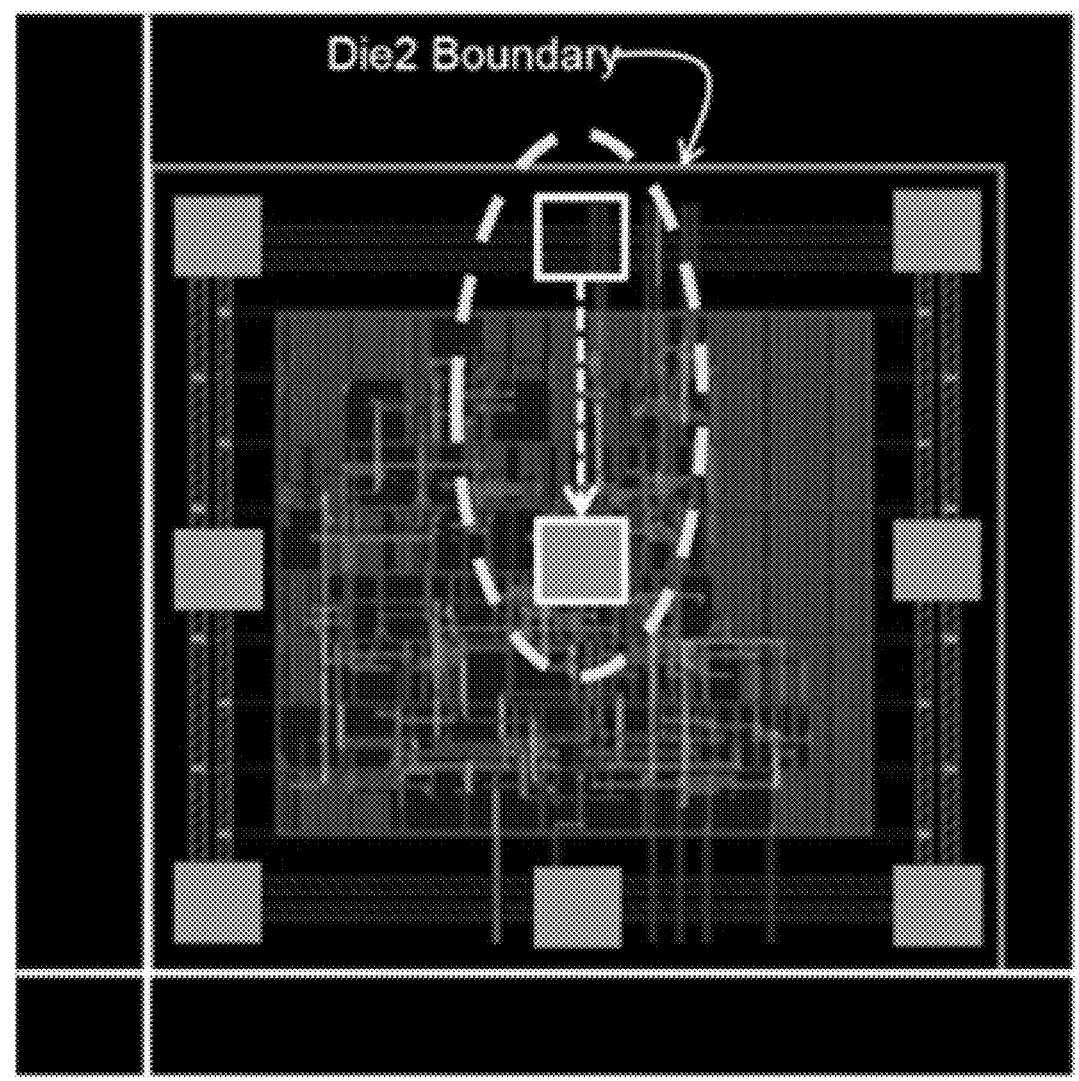
FIG. 5 is a diagram depicting package and/or die layouts in accordance with an embodiment of the present disclosure.

Referring also to FIGS. 4-5, diagrams 400 and 500 consistent with an embodiment of mirroring process 10 are provided. Diagram 400 shows an example where a user may move a pad in a package footprint (here the arrow shows the pad move) and diagram 500 shows that Edit-in-Concert may automatically move the corresponding pad in the actual die layout.

Figure 6:
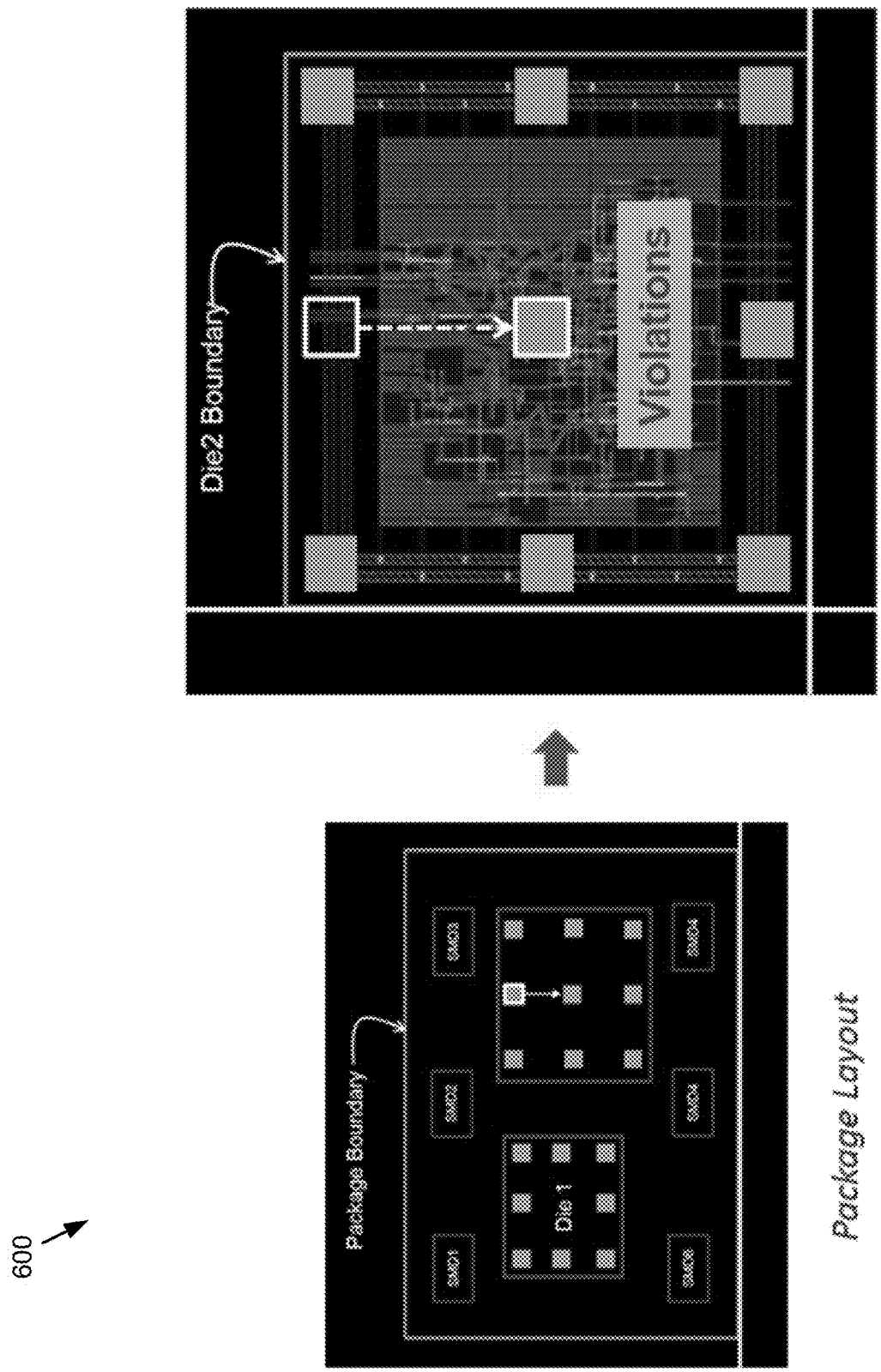
FIG. 6 is a diagram depicting package and/or die layouts in accordance with an embodiment of the present disclosure.

Referring also to FIG. 6, an example is provided where a user was editing in the package layout, and Edit-In-Concert automatically mirrored the edits in the actual die layout. The problem is, this introduces violations (e.g., DRC and shorts) on the die layout without the user's knowledge. In this example, an Edit-In-Concert operation may automatically move the pad in the die layout, and it can get easily placed overlapping existing shapes (or very near to them), causing extensive violations as shown. This is because the die layouts are densely packed designs, and any change needs high precision. However, the user is not aware of these violations since he/she is working on the package layout, and made the original move there, and not on this die layout. The user will later realize these violations when he opens the die layout, but then it may take many iterations between the package and die layout to correct the mess.

Accordingly, in operation, an in accordance with embodiments of mirroring process 10 as a user is editing the die footprint in package layout, mirroring process 10 may be configured to mirror the changes in the die layout. Mirroring process 10 may then dynamically check the impact of that edit on the die layout (e.g., DRC violations, shorts, etc.). A live display of the violations occurring in die layout may be provided on the package layout while retaining full context between package layout and die layout. This informs the user upfront if the edits in package layout will cause any violations in the die layout, in which case user can avoid that edit and avoid costly iterations later on.

Figure 7:
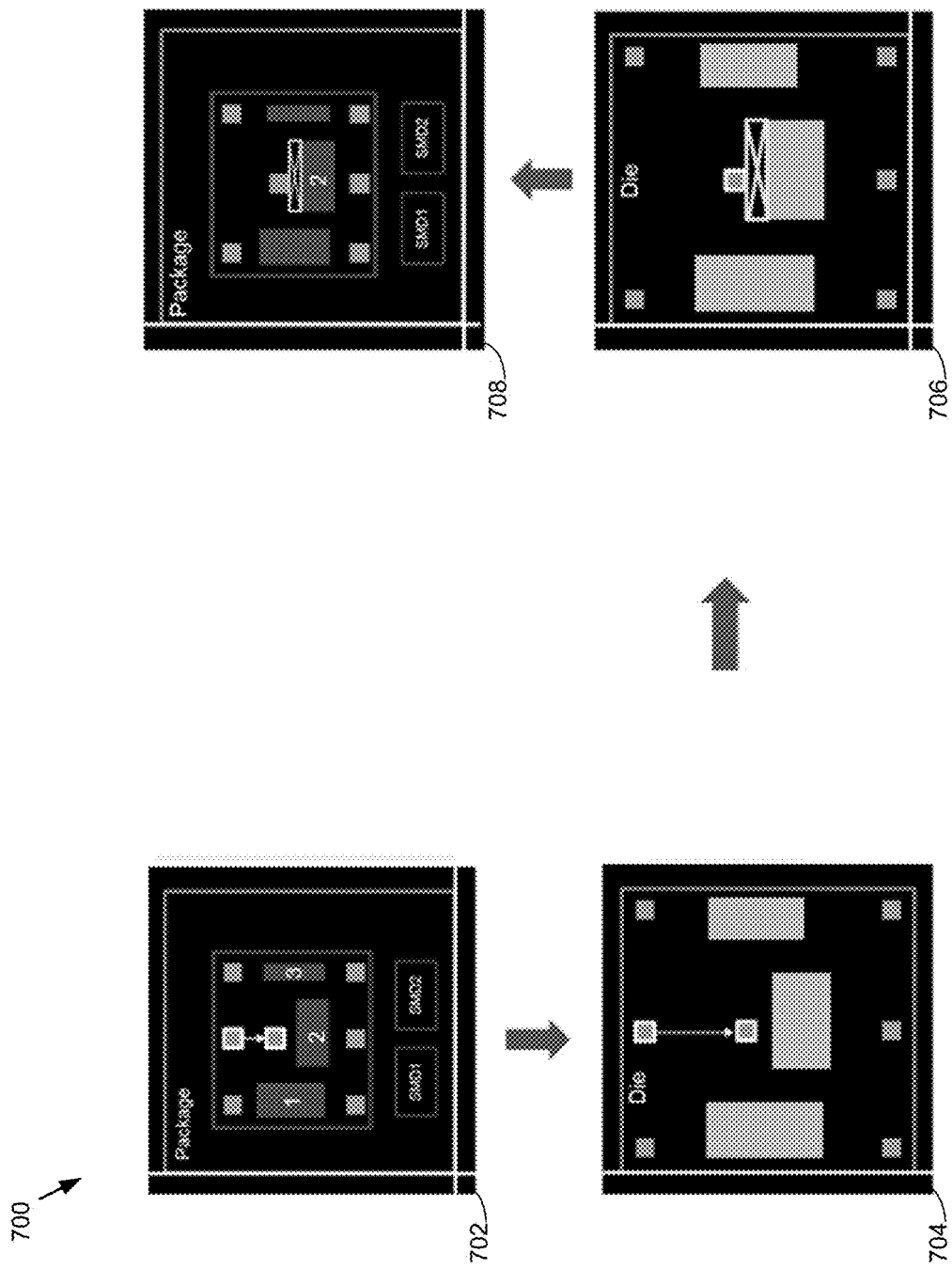
FIG. 7 is a diagram depicting package and/or die layouts in accordance with an embodiment of the present disclosure.

Referring now to FIG. 7, an embodiment showing operations consistent with mirroring process 10 is provided. GUI 702 shows an example where a package is being edited in the foreground. The die layout may be displayed in the background in Co-Design Mode (e.g., shapes 1,2,3 from the die layout may be displayed in dimmed colors). As shown in GUI 704, mirroring process 10 may automatically move the pad in the die layout as discussed earlier. DRC checking may be automatically triggered in the die layout to detect spacing violations due to the move as shown in GUI 706. Violations from the die layout may be displayed (with appropriate scaling) in package layout as shown in GUI 708. Some or all of this may occur in real time. As such, the user may see the violation and retract the pad away from shape 2 by an appropriate distance until the violations disappear. Hence, the user may be able to edit the package safely without creating any violations on the die.

Figure 8:
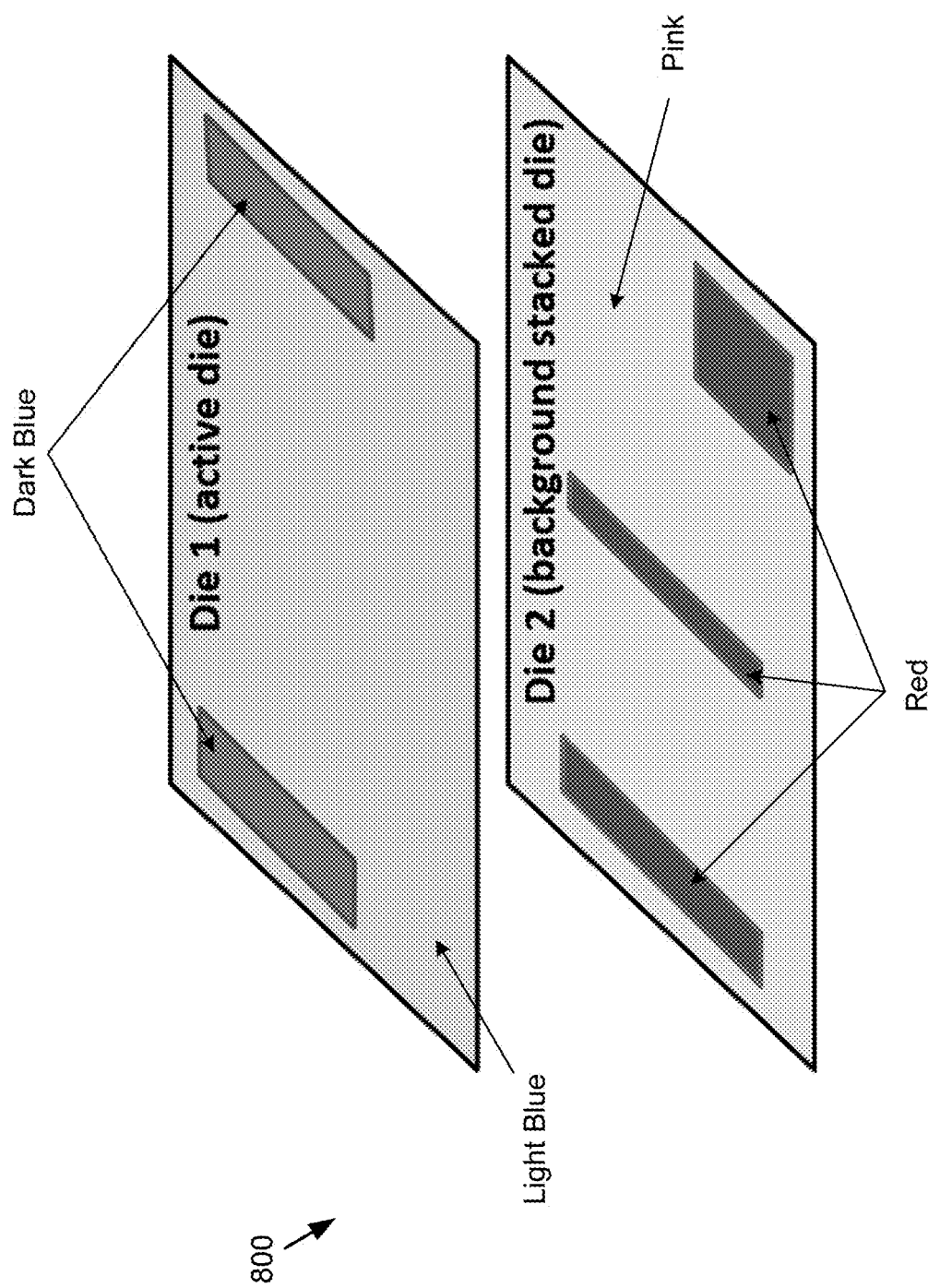
FIG. 8 is a diagram depicting package and/or die layouts in accordance with an embodiment of the present disclosure.
Figure 9:
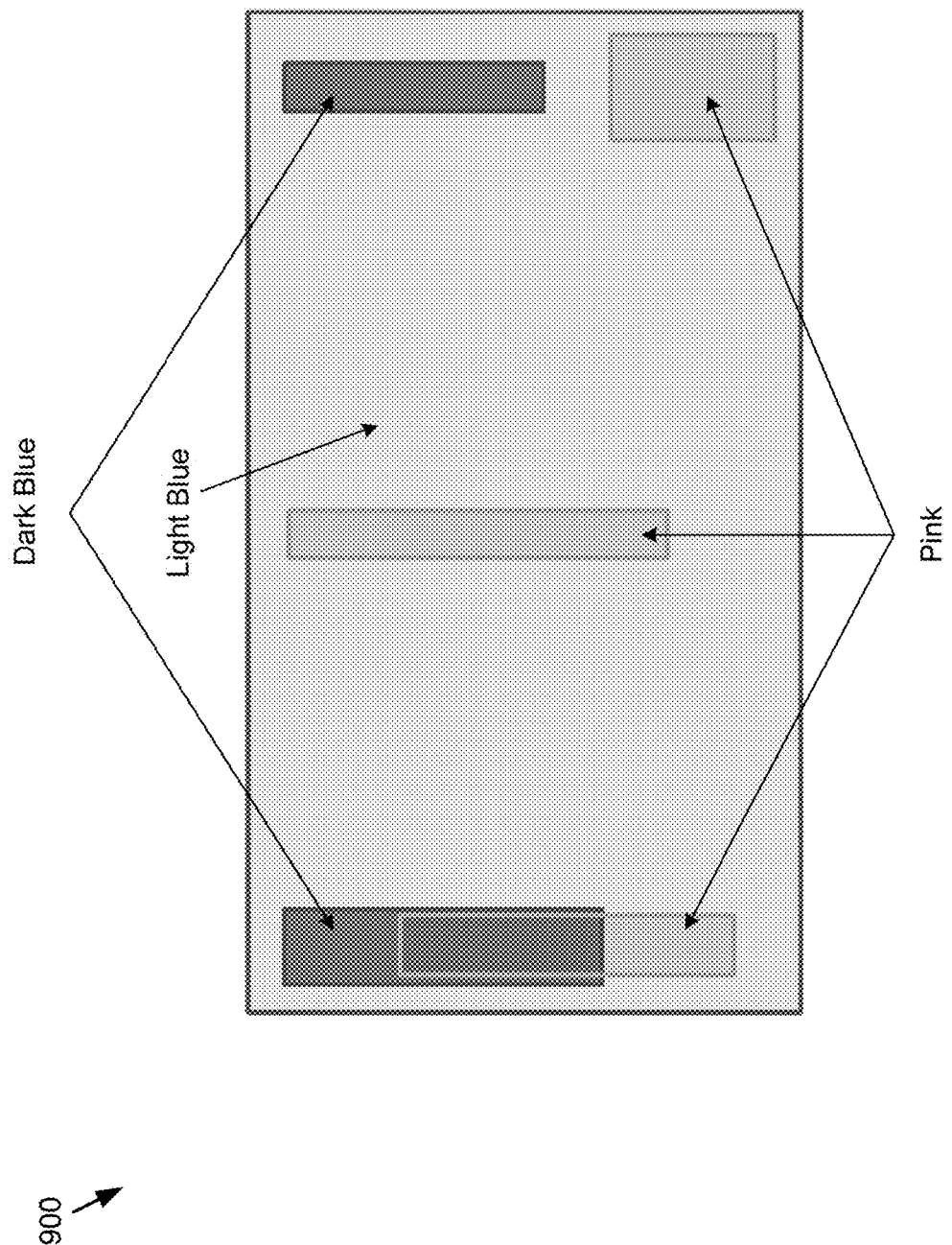
FIG. 9 is a diagram depicting package and/or die layouts in accordance with an embodiment of the present disclosure.

Referring now to FIGS. 8-9, embodiments of mirroring process 10 using 3D/2.5D IC (interposers) designs are provided. FIG. 8 shows a 3D view and FIG. 9 shows an example of a Co-Design View. In FIG. 8, the Blue-Die (Die-1) is in foreground, it's active/editable, and the user may be working on it. The adjacent Red-Die (Die-2) may be stacked below the Blue-Die, and may be displayed in the background with dimmed shapes. This enables the designer to work on an active die in the context of an adjacent die on a 2D canvas. It should be noted that any reference to a colored die (e.g. red, blue, etc.) may, in some cases, indicate merely a differentiation between bright or dim shades and not necessarily different colors.

Referring now to FIGS. 10A-10E, embodiments of mirroring process 10 showing an example of design rule check awareness in a 3D/2.5D co-design flow is provided. These figures show a series of operations showing one use of mirroring process 10. These figures demonstrate how a user may safely avoid design rule violations in both dies.

Figure 10A:
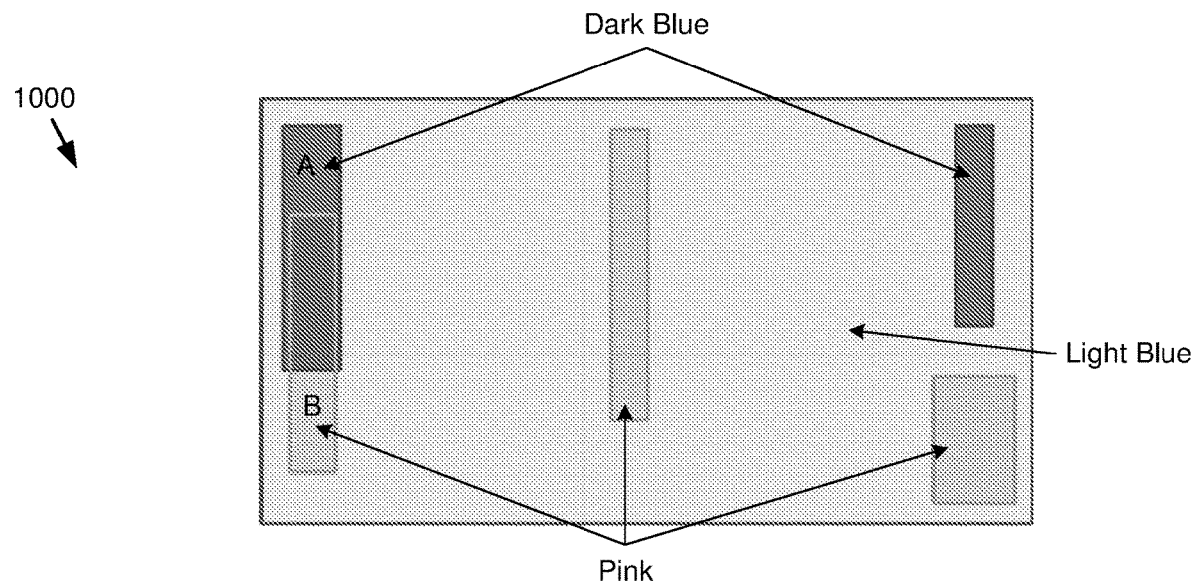
FIGS. 10A-10E are diagrams depicting package and/or die layouts in accordance with an embodiment of the present disclosure.
Figure 10B:
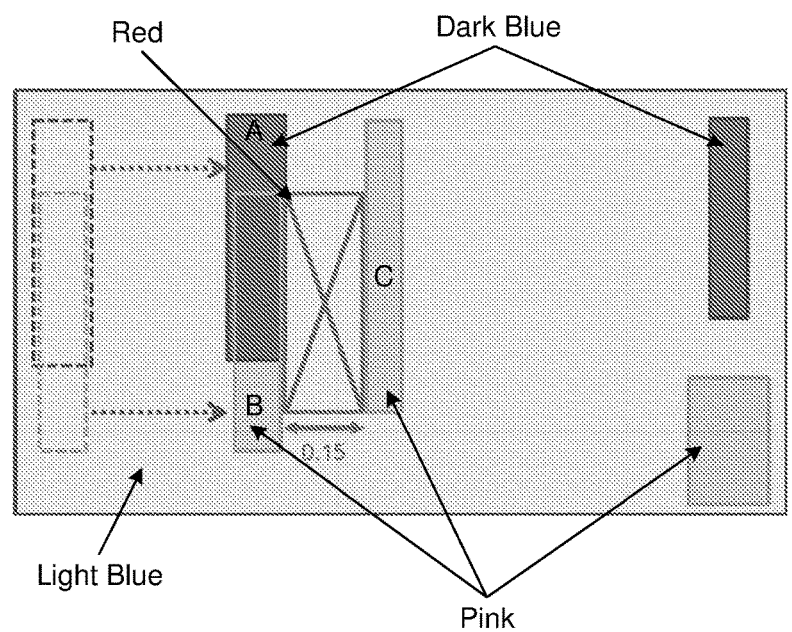

FIG. 10A shows an original position of blue shape "A" on a Blue-Die, and a red shape "B" on a Red-Die. If a user edits "A", assume that the process described herein may edit "B" as well. FIG. 10B indicates an example of DRC awareness in a 3D/2.5D co-design. In operation, a user moves "A" on Blue-Die and mirroring process 10 may automatically move "B" on the Red-Die. Here, the tool may detect a minimum spacing violation on the Red-Die, as the two red shapes "B" and "C" have come too close. As such, mirroring process 10 may be configured to displays the violation (from the Red-Die) in the Blue-Die itself. Accordingly, the user knows this move is not good from the Red-Die's perspective.

Figure 10C:
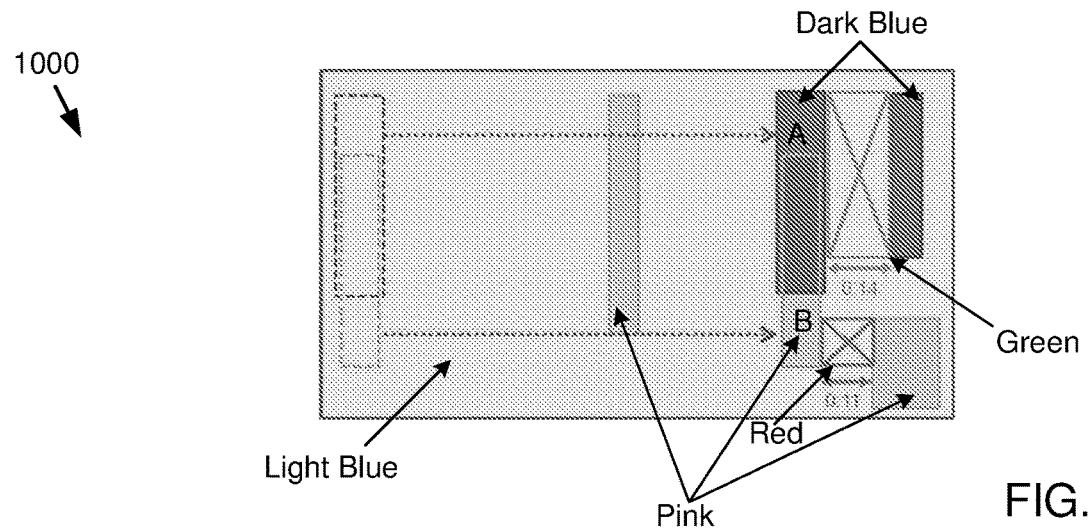

Referring again to FIG. 10C, an example depicting simultaneous die DRC awareness is provided. In this example, the user does not place "A" there and instead moves it further ahead. However, it now is too close to another blue shape "D" on the Blue-Die. And the Edit-In-Concert operation may also move "B" too close to another red shape "E" on the Red-Die. As shown in FIG. 10C, using mirroring process 10 both violations may be flagged simultaneously on both dies, in different colors for easy distinguishing.

Figure 10D:
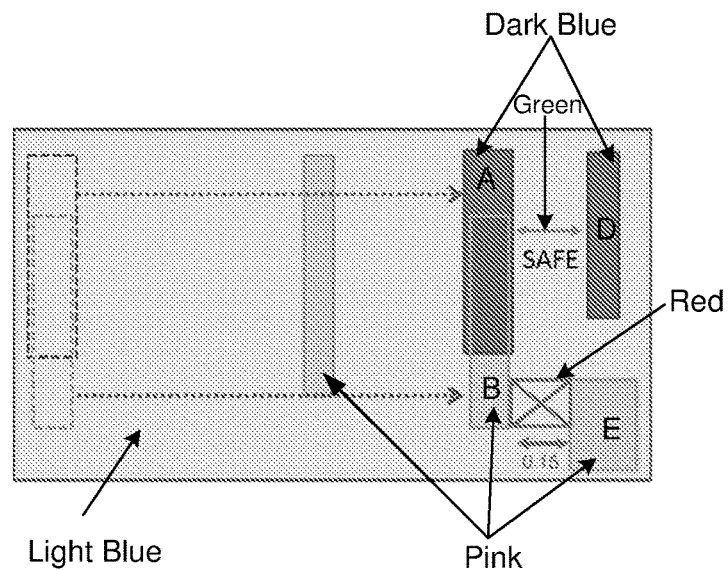

Referring now to FIG. 10D, an example depicting repositioning according to mirroring process 10 is provided. In this example, the user backs up a little, and the violation on Blue-Die is gone, however the spacing on the Red-Die still does not meet the DRC requirement. It should be noted that some or all of this is happening dynamically as the user is moving the shapes (e.g., attached to his/her mouse cursor), trying to find an appropriate position without violating any of the dies.

Figure 10E:
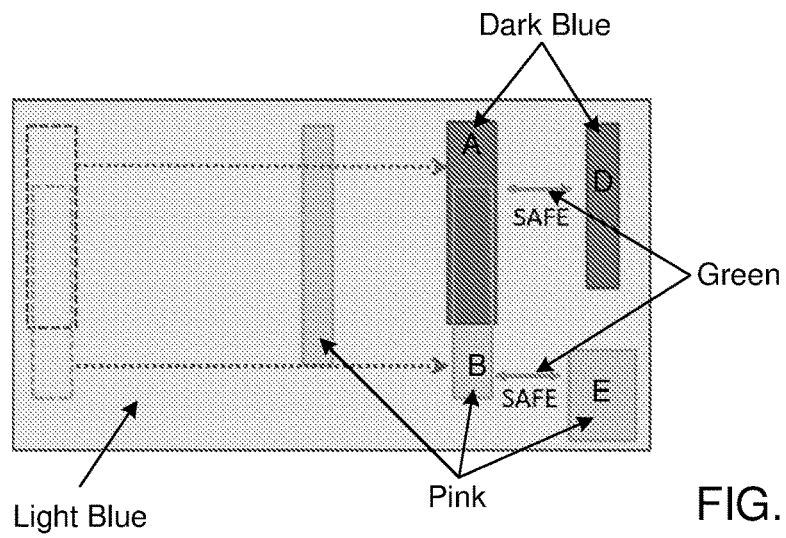

Referring now to FIG. 10E, an example depicting further repositioning according to mirroring process 10 is provided. In this example, the user backs up a little more, and now there are no violations, all markers are gone. The user may terminate the move command, and place both shapes safely. There are no violations on any of the dies.

Figure 11:
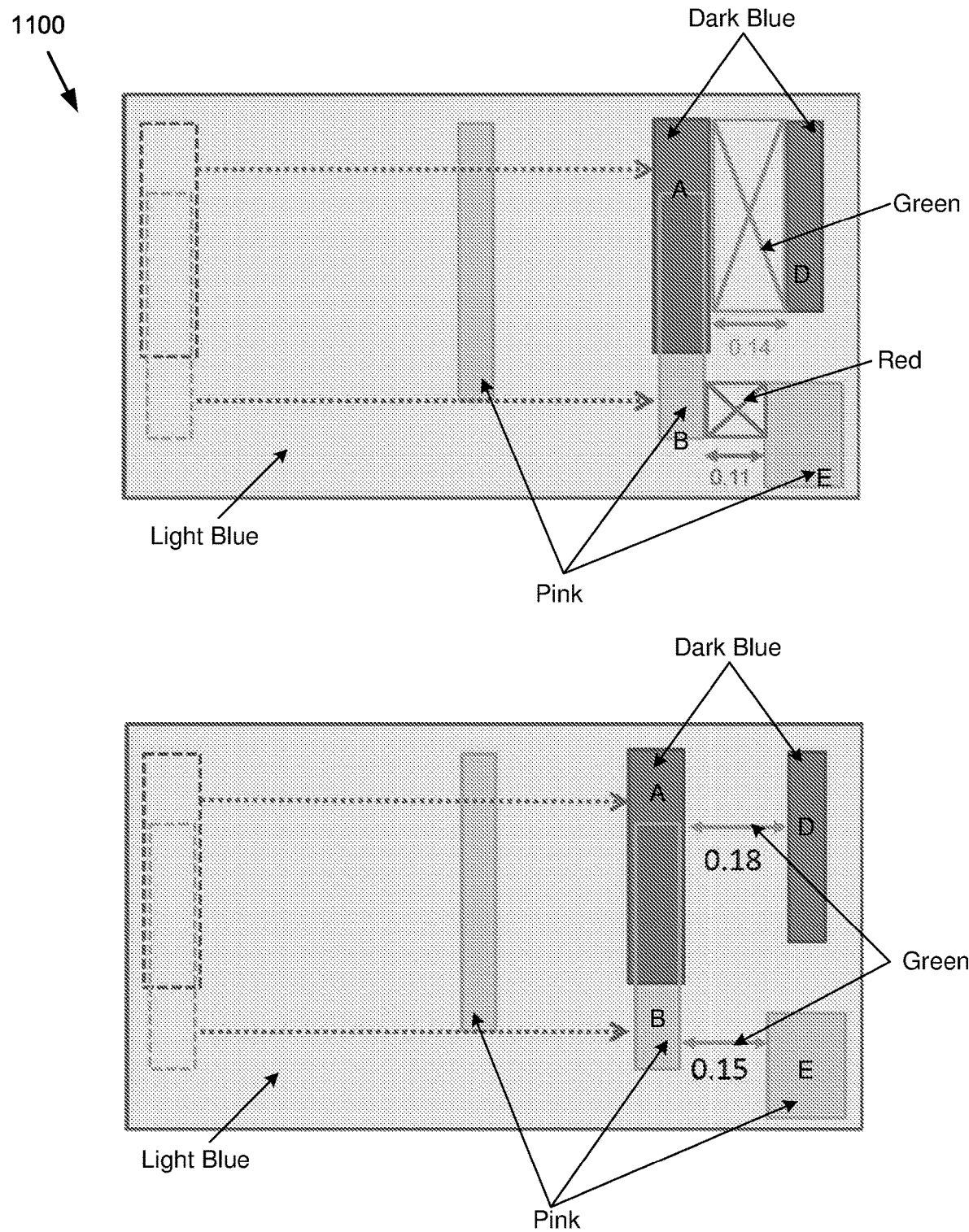
FIG. 11 is a diagram depicting package and/or die layouts in accordance with an embodiment of the present disclosure.
Figure 12:
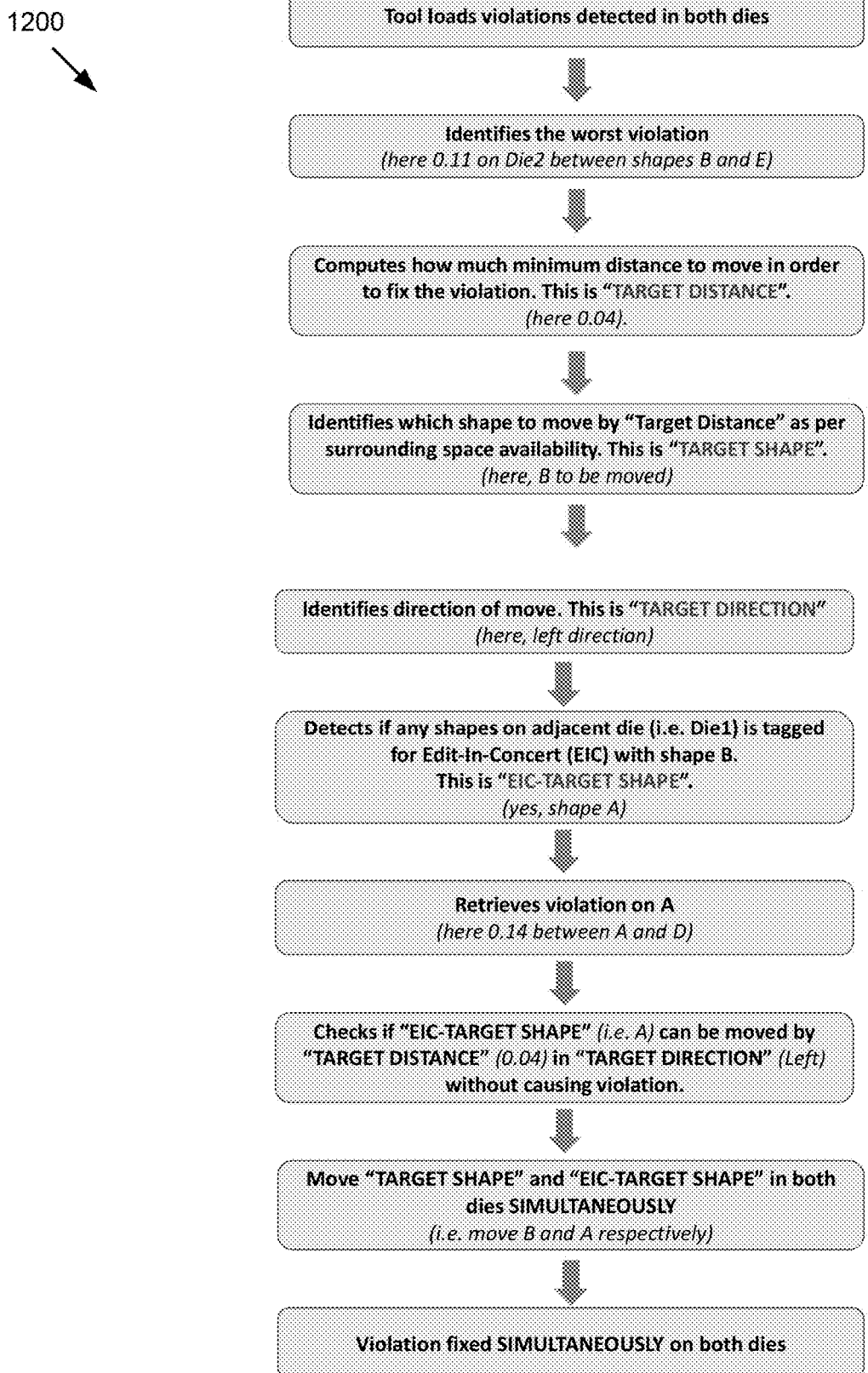
FIG. 12 is a flowchart depicting operations in accordance with an embodiment of the present disclosure.

Referring now to FIG. 11, another embodiment consistent with mirroring process 10 is provided. In this example, assume there are violations in both dies as shown earlier. This figure shows an example of how mirroring process 10 may be used to show simultaneous fixing in both dies. Here, mirroring process 10 may be able to automatically push back shapes "A" and "B" by just that much spacing from shapes "D" and "E" that is needed to avoid violation in both dies, while ensuring that the relative position between "A" and "B" is not changed. As an example, for simplicity assume that the minimum spacing requirement in both dies was 0.15. As "B" and "E" were closer to each other than "A" and "D", "B" was first pushed back by 0.04 to achieve 0.11+ 0.04=0.15 spacing from "E" which met the minimum spacing rule. Accordingly, that meant "A" has to be pushed back by same 0.04 in order to maintain relative position between "A" and "B". In this way, "A" and "D" spacing becomes 0.14+0.04=0.18, which also met the rule. Now both dies are safe without any violations. Getting both dies fixed in one shot saves user effort. FIG. 12 shows one example flowchart indicating operations that may be used when perform simultaneous fixing across multiple dies.

In some embodiments, mirroring process 10 may be used on different technologies. For example, a Blue-Die on 90 nm and a Red-Die on 45 nm. As such, violations on each die may be computed as per the technology (e.g., technology file definition) of that die.

As discussed herein, embodiments of mirroring process 10 may be used to perform numerous operations. Some of these include, but are not limited to, cross design violation detection, cross design violation display, simultaneous violation detection and display in co-design, simultaneous violation fixing across dies, etc. In cross design violation detection, as a user is editing a first design, mirroring process 10 may dynamically check the impact of that edit on a second design, and detect if any design rules violations are committed. In cross design violation display if there are any violations caused in the second design, it shows the violation markers on the first design, thereby giving "live" feedback to the user of what violations are caused in the second design due to the edits on the first design. In simultaneous violation detection and display in co-design, mirroring process 10 may be configured to simultaneously detect violations on the first and second designs, and simultaneously display the violation markers on the canvas of the first design in different colors (for ease of distinguishing) while the editing operations are ongoing. In simultaneous violation fixing across dies mirroring process 10 may be configured to fix violations simultaneously in both dies as per the design rules of each die. It may calculate the minimum movement needed to fix both the dies.

It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:

1. A computer-implemented method comprising:
   providing, using a processor, an electronic design having a package layout and a die layout associated therewith;
   displaying at a graphical user interface, the package layout;
   allowing, at the graphical user interface, a user to edit the package layout;
   determining, using the processor, that the edit of the package layout generated at least one of a design rule check violation and a short on the die layout;
   in response to the edit, mirroring the edit at the die layout; and
   displaying at least one of the design rule check violation and the short at the die layout on the graphical user interface while the package layout is being displayed in real-time.

2. The computer-implemented method of claim 1, further comprising:
   allowing, at the graphical user interface, the user to alter the edit based upon, at least in part, the determining.

3. The computer-implemented method of claim 1, further comprising:
   determining an impact of the edit on the package layout.

4. The computer-implemented method of claim 3, further comprising:
   simultaneously displaying a violation associated with the package layout and a violation associated with the die layout at the graphical user interface.

5. The computer-implemented method of claim 1, further comprising:
   calculating a minimum movement at the package layout to satisfy one or more design rules associated with both the package layout and the die layout.

6. A system comprising:
   a computing device having at least one processor configured to provide an electronic design having a package layout and a die layout associated therewith, the at least one processor further configured to display at a graphical user interface, the package layout, the at least one processor further configured to allow, at the graphical user interface, a user to edit the package layout, the at least one processor further configured to determine, using the processor, that the edit of the package layout generated at least one of a design rule check violation and a short on the die layout and in response to the edit, the at least one processor further configured to mirror the edit at the die layout, the at least one processor further configured to display at least one of the design rule check violation and the short at the die layout on the graphical user interface while the package layout is being displayed in real-time.

7. The computing device of claim 6, further comprising: allowing, at the graphical user interface, the user to alter the edit based upon, at least in part, the determining.

8. The computing device of claim 6, further comprising: determining an impact of the edit on the package layout.

9. The computing device of claim 8, further comprising: simultaneously displaying a violation associated with the package layout and a violation associated with the die layout at the graphical user interface.

10. The computing device of claim 6, further comprising: calculating a minimum movement at the package layout to satisfy one or more design rules associated with both the package layout and the die layout.

11. A non-transitory computer readable medium having stored thereon instructions that when executed by a processor result in one or more operations, the operations comprising:

providing, using a processor, an electronic design having a package layout and a die layout associated therewith;

displaying at a graphical user interface, the package layout;

allowing, at the graphical user interface, a user to edit the package layout;

determining, using the processor, that the edit of the package layout generated at least one of a design rule check violation and a short on the die layout;

in response to the edit, mirroring the edit at the die layout; and displaying at least one of the design rule check violation and the short at the die layout on the graphical user interface while the package layout is being displayed in real-time.

12. The non-transitory computer readable medium of claim 11, wherein operations further comprise:

allowing, at the graphical user interface, the user to alter the edit based upon, at least in part, the determining.

13. The non-transitory computer readable medium of claim 11, wherein operations further comprise:

determining an impact of the edit on the package layout.

14. The non-transitory computer readable medium of claim 13, wherein operations further comprise:

simultaneously displaying a violation associated with the package layout and a violation associated with the die layout at the graphical user interface.

\* \* \* \* \*